(12) United States Patent
Kitayoshi

(10) Patent No.: US 6,804,617 B2
(45) Date of Patent: Oct. 12, 2004

(54) FIELD DISTRIBUTION MEASURING METHOD AND DEVICE

(75) Inventor: Hitoshi Kitayoshi, Tokyo (JP)

(73) Assignees: Advantest Corporation; Minister for Public Management, Home Affairs, Posts and Telecommunications

( * ) Notice: Subject to any disclaimer, the term of this patent is extended or adjusted under 35 U.S.C. 154(b) by 0 days.

(21) Appl. No.: 10/019,181

(22) PCT Filed: Apr. 19, 2001

(86) PCT No.: PCT/JP01/03344

§ 371 (c)(1),
(2), (4) Date: Jul. 8, 2002

(87) PCT Pub. No.: WO01/84165

PCT Pub. Date: Nov. 8, 2001

(65) Prior Publication Data

US 2003/0109997 A1 Jun. 12, 2003

(30) Foreign Application Priority Data

Apr. 28, 2000 (JP) ..................... 2000-129802

(51) Int. Cl.$^7$ ............................. G01R 23/00
(52) U.S. Cl. ............. 702/75; 702/76; 702/57; 324/95
(58) Field of Search ............... 702/76, 37, 64–67, 702/69, 70, 73, 75, 77, 79, 89, 94, 95, 109, 106, 115, 124–126, 141, 150, 152, 189, 191, 195, 176, 178, FOR 103, FOR 104–FOR 108, FOR 110, FOR 169–FOR 171, FOR 134, FOR 194, FOR 137, FOR 154, FOR 156, FOR 166, FOR 168; 324/72, 72.5, 96, 95, 457, 244, 263, 260, 200, 202, 254, 244.1, 245, 246; 343/703; 340/657

(56) References Cited

U.S. PATENT DOCUMENTS 5,028,866 A * 7/1991 Wiese ..................... 324/750
5,300,879 A * 4/1994 Masuda et al. ............ 324/95
6,411,104 B1 * 6/2002 Uesaka et al. ........... 324/633
6,470,282 B1 * 10/2002 Uesaka ..................... 702/57

FOREIGN PATENT DOCUMENTS

JP      60-192271     9/1985
JP       3-48776      3/1991
JP       6-242163     9/1994

* cited by examiner

*Primary Examiner*—Hal Wachsman
(74) *Attorney, Agent, or Firm*—Muramatsu & Associates

(57) ABSTRACT

A field distribution measuring method for measuring a spatial distribution of an electric field or a magnetic field at a plurality of sampling points. The method includes the steps of continuously sweeping the sampling points by a probe, in which, based on spurious spectra generated by offsets between positions of the probe and measuring timings, a shift amount of the sampling points is computed, and, taking into account the shift amount, a distribution of electric fields or magnetic fields is measured. The method further includes a step of removing the measured noises generated due to the offsets between sweeping positions of the probe and the measuring timings.

14 Claims, 7 Drawing Sheets

AMPLITUDE DATA

PHASE DATA

AMPLITUDE DATA

PHASE DATA

FIELD DISTRIBUTION MEASURING METHOD AND DEVICE

TECHNICAL FIELD

The present invention relates to a field distribution measuring method and apparatus for measuring a distribution of an electric field or a magnetic field by a probe sweeping, more specifically, to a field distribution measuring method and apparatus which can eliminate measured noises generated due to offsets between probe sweeping positions and measuring timings.

BACKGROUND ART

Small antenna directivity evaluation apparatuses and electromagnetic wave monitoring visualizing apparatuses must measure two-dimensional distributions of electric fields or magnetic fields. These apparatuses have conventionally used a field measurement method in which a probe sweeps two-dimensionally to measure two-dimensional distributions of electric fields or magnetic fields.

The conventional field distribution measuring method and apparatus will be explained with reference to FIG. 6.

A field distribution measurement screen 100 which defines an area in which electric fields or magnetic fields are to be measured includes a probe 102 for detecting electric fields or magnetic fields. The probe 102 is connected to a probe sweep control unit 104 and can sweep in the x-axial direction and the y-axial direction. The probe 102 is connected to a measuring unit 106 which measures electric fields or magnetic fields, based on signals from the probe 102. The probe sweep control unit 104 outputs a measurement trigger signal corresponding to a position of the probe 102 and supplies the measurement trigger signal to the measuring unit 106. Data F of the electric fields or magnetic fields measured by the measuring unit 106 are recorded in a buffer memory 108 together with position information supplied by the probe sweep control unit 104. The buffer memory 108 is connected to a computing/display unit 110 which processes and displays in two-dimensional plane measured data stored in the buffer memory 108.

In the field distribution measuring apparatus shown in FIG. 6, a field distribution is measured by the probe 102 sweeping the field distribution measurement screen 100 while electric fields or magnetic fields being measured on the field distribution measurement screen 100, and measured electric fields or magnetic fields are processed together with position information of the probe 102.

The probe 102 continuously sweeps the field distribution measurement screen 100 without pausing at each sampling point (measuring point) so that the probe 102 can sweep without loss for maximum measurement throughput. As exemplified in FIG. 6, the probe 102 is moved in the positive direction along the x-axis, then moved by a prescribed value in the positive direction along the y-axis, next moved in the negative direction along the x-axis, then moved by a prescribed value in the positive direction along the y-axis, and then moved in the positive direction along the x-axis. The probe 102 repeats these motions so as to sweep substantially all the surface of the field distribution measurement screen 100 (hereinafter call such sweep "zigzag sweep").

The probe sweep control unit 104 outputs measurement trigger signals corresponding to positions of the probe 102 while the probe 102 is sweeping the field distribution measurement screen 100. As exemplified in FIG. 7, a plurality of x coordinates are set in advance, spaced equidistantly from each other along the x-axis, and when an x coordinate of a position of the probe 102 comes to each of the set x-coordinates, the probe sweep control unit 104 outputs a measurement trigger signal. The measurement trigger signals are supplied to the measuring unit 106.

The measuring unit 106 judges a signal detected by the probe 102 when the measuring unit 106 received the measurement trigger signal to be information of electric fields or magnetic fields, and measures the electric fields or magnetic fields, based on the signal outputted by the probe 102.

Data of electric fields or magnetic fields thus measured are stored by the buffer memory 108 together with position information (coordinates (x,y)) of the probe outputted by the prove sweep control unit.

Next, the data stored by the buffer memory 108 are developed on a two-dimensional plane by the computing/display unit 110, and a two-dimensional field distribution of electric fields or magnetic fields can be displayed.

However, there is a delay time from detection of a measurement trigger signal to output of a measured value. Accordingly, in the conventional field distribution measuring method described above, in which the probe continuously sweeps without pausing at each sampling position for higher measuring throughputs, an x coordinate of the probe 102 at the time of outputting a measurement trigger signal is displaced from an x coordinate of the probe 102 at the time of the actual measurement.

Furthermore, as shown in FIG. 7, when the probe 102 sweeps zigzag, the shift of coordinates on an odd number-th line on the y-axis and that of coordinates on an even number-th line on the y-axis take place in directions opposite to each other. That is, on an odd number-th line on the y-axis, where the probe is moved along the x-axis in the positive direction, sampling points shift in the positive direction (circled in FIG. 7). Oppositely, on an even number-th line on the y-axis, where the probe is moved along the x-axis in the negative direction, sampling points shift in the negative direction (crossed in FIG. 7). A deviation amount of the sampling points between the odd number-th line and the even number-th line is $2 \times v \times t_d$ [m] by which x axial sampling positions on both lines deviates from each other for the same trigger point when a sweeping velocity of the probe is v [m/s], and a delay time is $t_d$ [see].

Accordingly, by developing a field distribution on a two-dimensional plane, based on the position information outputted by the probe sweep control unit 104, correct two-dimensional images of electric fields or magnetic fields cannot be obtained.

DISCLOSURE OF INVENTION

An object of the present invention is to provide a field distribution measuring method and apparatus for measuring a distribution of electric fields or magnetic fields by continuously sweeping a probe, wherein measuring noises generated due to offsets between sweeping positions of the probe and measuring timings can be removed.

The above-described object can be achieved by a field distribution measuring method for measuring an electric field or a magnetic field by a probe measuring at a plurality of sampling points while continuously sweeping, wherein a shift amount of the sampling points is computed, based on a spurious spectrum generated by a displacement between a position of the probe and a measuring timing, and a distribution of the electric field or the magnetic field is measured in consideration of the shift amount.

In the above-described field distribution measuring method, it is possible that the method comprises the steps of: storing a plurality of measured data obtained by the probe sweeping in a first direction together with position information of the probe as reference data; storing a plurality of measured data obtained by the probe sweeping in a second direction opposite to the first direction together with position information of the probe as adjustment data; interpolating the adjustment data to compute interpolated data with data between the sampling points interpolated; computing spatial frequency power spectra for the reference data and the interpolated data; and computing the shift amount of the sampling points, based on the spatial frequency power spectra.

In the above-described field distribution measuring method, it is possible that the shift amount of the sampling points is computed based on an accumulated value of the spatial frequency power spectra.

In the above-described field distribution measuring method, it is possible that the shift amount of the sampling points is judged, based on a point where the accumulated value of the spatial frequency power spectra is below a prescribed value.

In the above-described field distribution measuring method, it is possible that the shift amount of the sampling points is judged, based on a point where the accumulated value of the spatial frequency power spectra is minimum.

In the above-described field distribution measuring method, it is possible that the shift amount of the sampling points is computed in consideration of acceleration and deceleration of the probe.

In the above-described field distribution measuring method, it is possible that the probe sweeps on a two-dimensional plane.

In the above-described field distribution measuring method, it is possible that the probe sweep in a three-dimensional space.

The above-described object can be also achieved by a field distribution measuring apparatus comprising: a probe for detecting an electric field or a magnetic field at a plurality of sampling points while continuously sweeping on a plane or in a space; a measuring unit for measuring the electric field or the magnetic field detected by the probe; a storing unit for storing data of the electric field or the magnetic field measured by the measuring unit together with position data of the probe; a data processing unit for computing a shift amount of sampling points generated by a displacement between a position of the probe and a measuring timing, based on data stored in the storing unit; and a computing unit for computing a spatial distribution of the electric field or the magnetic field detected by the probe, in consideration of the shift amount of the sampling points computed by the data processing unit.

In the above-described field distribution measuring apparatus, it is possible that the data processing unit computes the shift amount of the sampling points, based on a spurious spectrum generated by the displacement between the position of the probe and the measuring timing.

According to the present invention, a field distribution measuring method for measuring a spatial distribution of an electric field or a magnetic field at a plurality of sampling points by the probe continuously sweeping the sampling points, in which, based on spurious spectra generated by offsets between positions of the probe and measuring timings, a shift amount of the sampling points is computed, and, taking into account the shift amount, a distribution of electric fields or magnetic fields is measured. Thus, measured noises generated due to offsets between sweeping positions of the probe and measuring timings can be properly removed.

BEST MODE FOR CARRYING OUT THE INVENTION

The field distribution measuring method and apparatus according to one embodiment of the present invention will be explained with reference to FIGS. 1 to 3.

Figure 1:
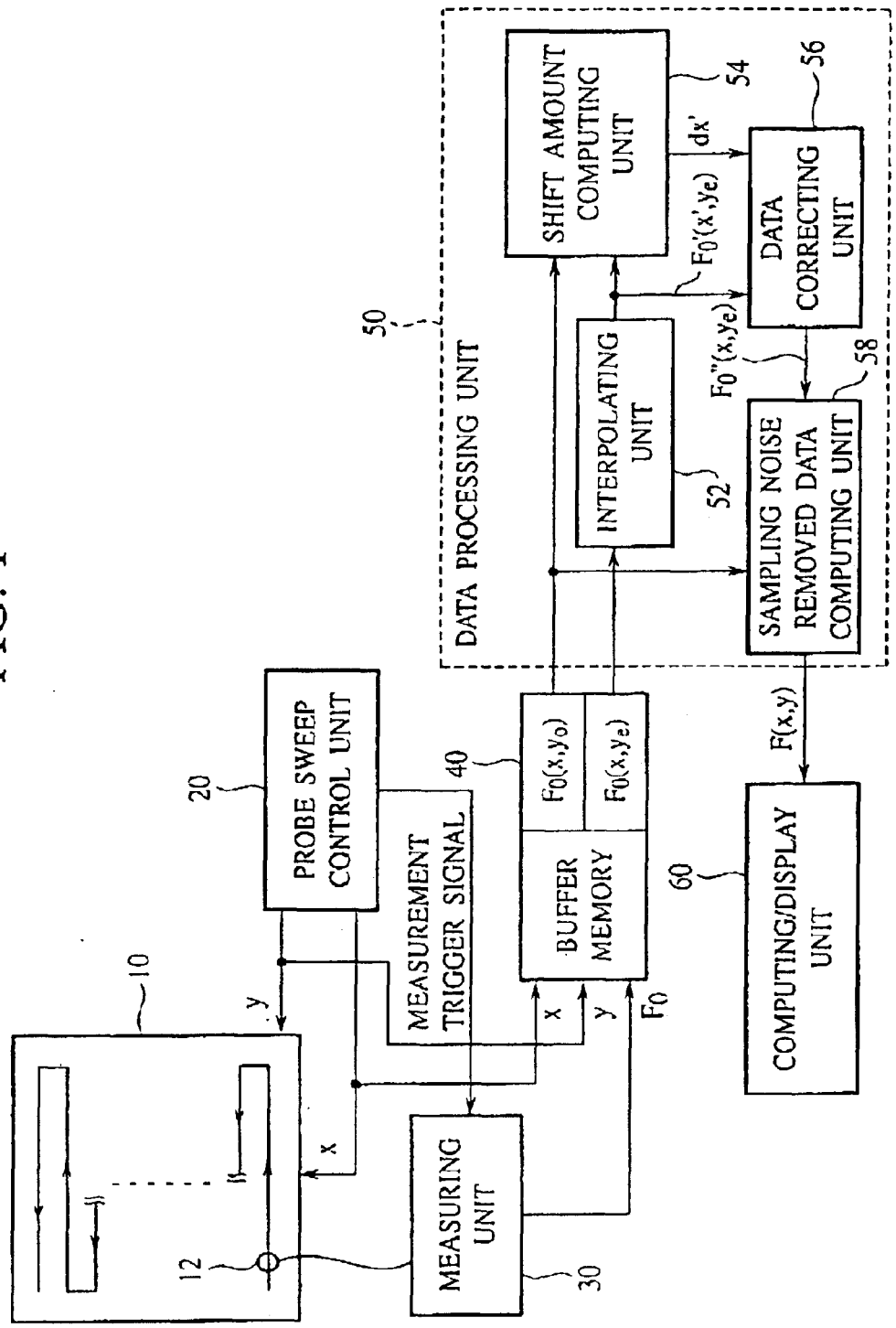
FIG. 1 is a block diagram explaining the field distribution measuring method and apparatus according to one embodiment of the present invention.

FIG. 1 is a block diagram of the field distribution measuring method and apparatus according to the present embodiment. FIG. 2 is a flow chart of a data processing method of the field distribution measuring method according to the present embodiment. FIG. 3 is a graph of relationships between accumulated values of frequency power spectra and sampling shift amounts.

First, the field distribution measuring apparatus according to the present embodiment will be explained with reference to FIG. 1.

A probe 12 for detecting electric fields or magnetic fields is provided on a field distribution measurement screen 10. The probe 12 is connected to a probe sweep control unit 20 and can sweep in the x-axis direction and in the y-axis direction within the field distribution measurement screen 10. The probe 12 is connected to a measuring unit 30 which measures electric fields or magnetic fields, based on signals from the probe 12. The probe sweep control unit 20 generates measurement trigger signals corresponding to positions of the probe 12 to input the measurement trigger signals to the measuring unit 30. Data $F_o$ of an electric field or a magnetic field measured by the measuring unit 30 can be stored in a buffer memory 40 together with position information supplied from the probe sweep control unit 20. The buffer memory 40 is connected to a data processing unit 50 which removes sampling noises in the measured data stored in the buffer memory 40. The data processing unit 50 is connected to a computing/display unit 60 which processes the sampling noise removed data processed by the data processing unit 50 to display the data on a two-dimensional plane.

The data processing unit 50 comprises an interpolating unit 52 which interpolates measured data stored in the buffer memory 40, a shift amount computing unit 54 which computes a shift amount of sampling points, based on spatial frequency spectra for the measured data and interpolated data, a data correcting unit 56 which corrects the measured data, based on a computed shift amount, and a sampling noise removed data computing unit 58 which computes sampling noise removed data, based on the measured data and the corrected data.

As described above, the field distribution measuring apparatus according to the present embodiment is characterized in that the data processing unit 50 for removing sampling noises from measured data is provided between the buffer memory 40 and the computing/display unit 60. The field distribution measuring apparatus having such constitution can remove sampling noises to thereby measure a correct two-dimensional field distribution.

Next, the field distribution measuring method according to the present embodiment will be explained with reference to FIGS. 1 and 2.

First, the field distribution measurement screen 10 is positioned opposed to an object-to-be-observed. The field distribution measurement screen 10 is set so as to provide a sampling interval sufficiently small for a change period of field distributions to be measured. For example, the field distribution measurement screen 10 is set to hold $$\lambda \gg L_1/N, \lambda \gg L_2/M$$

where a wavelength of electromagnetic waves or others to be measured is $\lambda$, a length of the field distribution measurement screen in the x-axis direction is $L_1$, a length of the field distribution measurement screen in the y-axis direction is $L_2$, a number of sampling points in the x-axis direction is N, and a number of sampling points in the y-axis direction is M.

Then, the probe 12 is caused to sweep by the probe control unit 20 to detect electric fields or magnetic fields at positions of the probe 12 on the field distribution measurement screen 10. In order to move the probe 12 effectively for a maximum measuring throughput, the probe 12 sweeps continuously zigzag on the field distribution measurement screen 10 without pausing at each sampling point (measuring point).

The probe sweep control unit 20 controls the probe 12 and outputs measurement trigger signals corresponding to positions of the probe 12. For example, a plurality of x coordinates are set equidistantly along the x-axis, and every time that an x coordinate of a position where the probe 12 is present is moved to each set point, the probe sweep control unit 20 outputs a measurement trigger signal. The measurement trigger signal is supplied to the measuring unit 30.

The measuring unit 30 judges a signal detected by the probe 12 when the measuring unit 30 received the measurement trigger signal to be information of an electric field or a magnetic field at the sampling point and, based on an output signal of the probe 12 at this time, carries out the measurement of the electric field or the magnetic field.

At this time, a delay time is present between the detection of the measurement trigger signal and the output of a measured value. The probe 12 does not pause at each sampling point but continuously sweeps zigzag for higher measuring throughputs. Accordingly, an x coordinate of the probe 12 at the time of outputting a measurement trigger signal is displaced from an x coordinate of the probe 12 at the time of the actual measurement.

Figure 7:
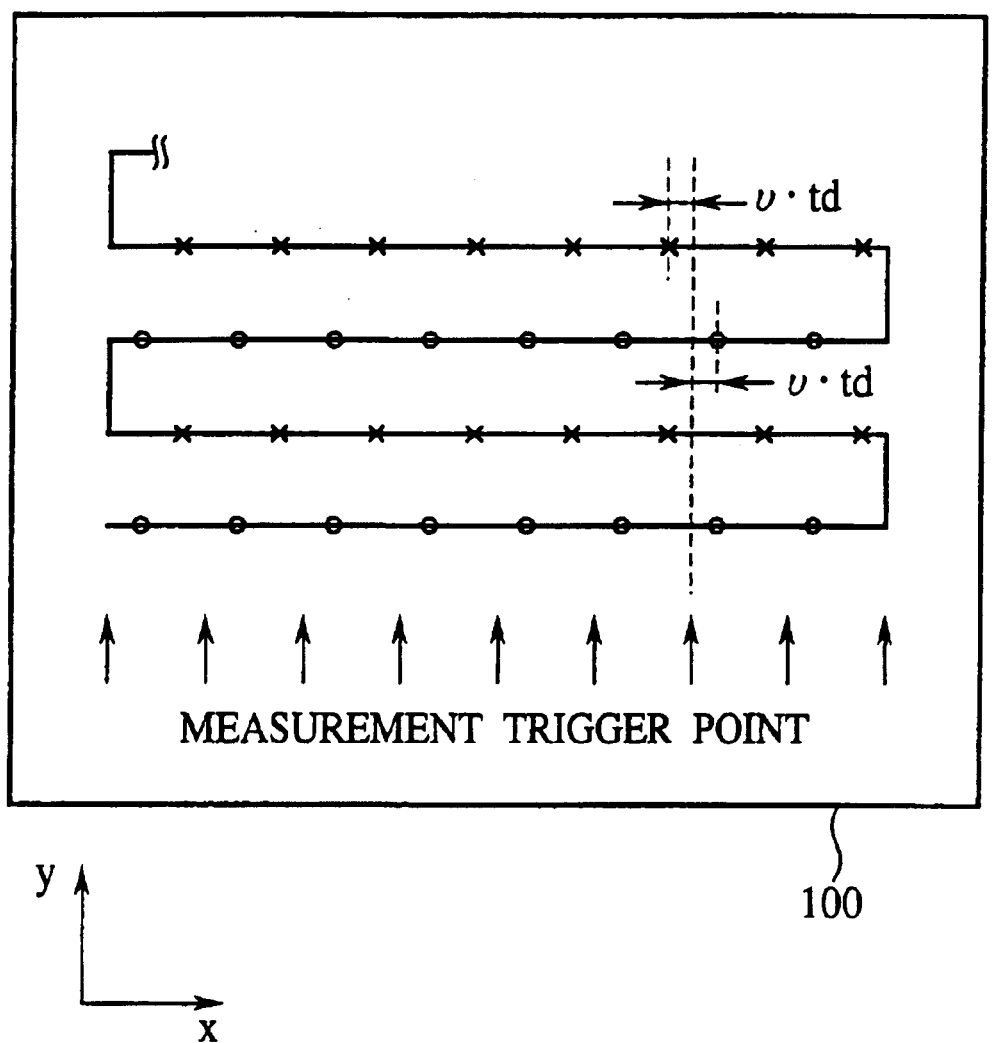
FIG. 7 is a view explaining the problem of the conventional field distribution measuring method and apparatus.

When the probe 12 sweeps zigzag as shown in FIG. 1, a shift direction of coordinates in an odd number-th line on the y-axis is opposite to that of coordinates in an even number-th line on the y-axis. That is, as shown in FIG. 7, in an odd number-th line on the y-axis, where the probe is moved along the x-axis in the positive direction, sampling points shift in the positive direction (circled in FIG. 7). Oppositely, in an odd number-th line on the y-axis, where the probe is moved along the x-axis in the negative direction, sampling points shift also in the negative direction (crossed in FIG. 7). A deviation amount of the sampling points for the same measurement trigger point between the odd-number-th line and the even number-th line is $2 \text{xvxt}_d [m]$ where a probe sweeping velocity is represented by v [m/s], and a delay time is represented by $t_d$ [sec].

Then, the thus-measured data $F_o$ of electric fields or magnetic fields are stored in the buffer memory 40 as measured data $F_o(x,y)$ together with position information of the probe 12 (coordinates (x,y)) outputted by the probe sweep control unit 20. At this time, the measured data $F_o(x,y)$ are divided into a plurality of groups to make one group reference sampling data and the other group adjustment data. For example, in the field distribution measuring method according to the present embodiment, in which the probe 12 sweeps zigzag on the two-dimensional plane, the measured data are divided into data of an odd number-th line on the y-axis, where the probe is moved along the x-axis in the positive direction (odd number-th line data $F_o(x,y_o)$), and into data of an even number-th line on the y-axis, where the probe is moved along the x-axis in the negative direction (even number-th line data $F_o(x,y_e)$), and the even number-th line data and the odd number-th line data are respectively stored in the buffer memory 40. In the present embodiment, the odd number-th line data $F_o(x,y_o)$ is the reference sampling data, and the odd number-th line data $F_o(x,y_e)$ is the adjustment data.

Here, x, y, $y_o$, $y_e$ are respectively $x = 1, 2, 3, \ldots, N, N+1$ $y = 1, 2, 3, \ldots, M-1, M$ $y_o = 1, 3, 5, \ldots, M-3, M-1$ $y_e = 2, 4, 6, \ldots, M-2, M.$ x is up to N+1 for the later spline interpolation. When no N+1-th data is absent, the N−1-th data can be used as the N+1-th data.

Figure 2:
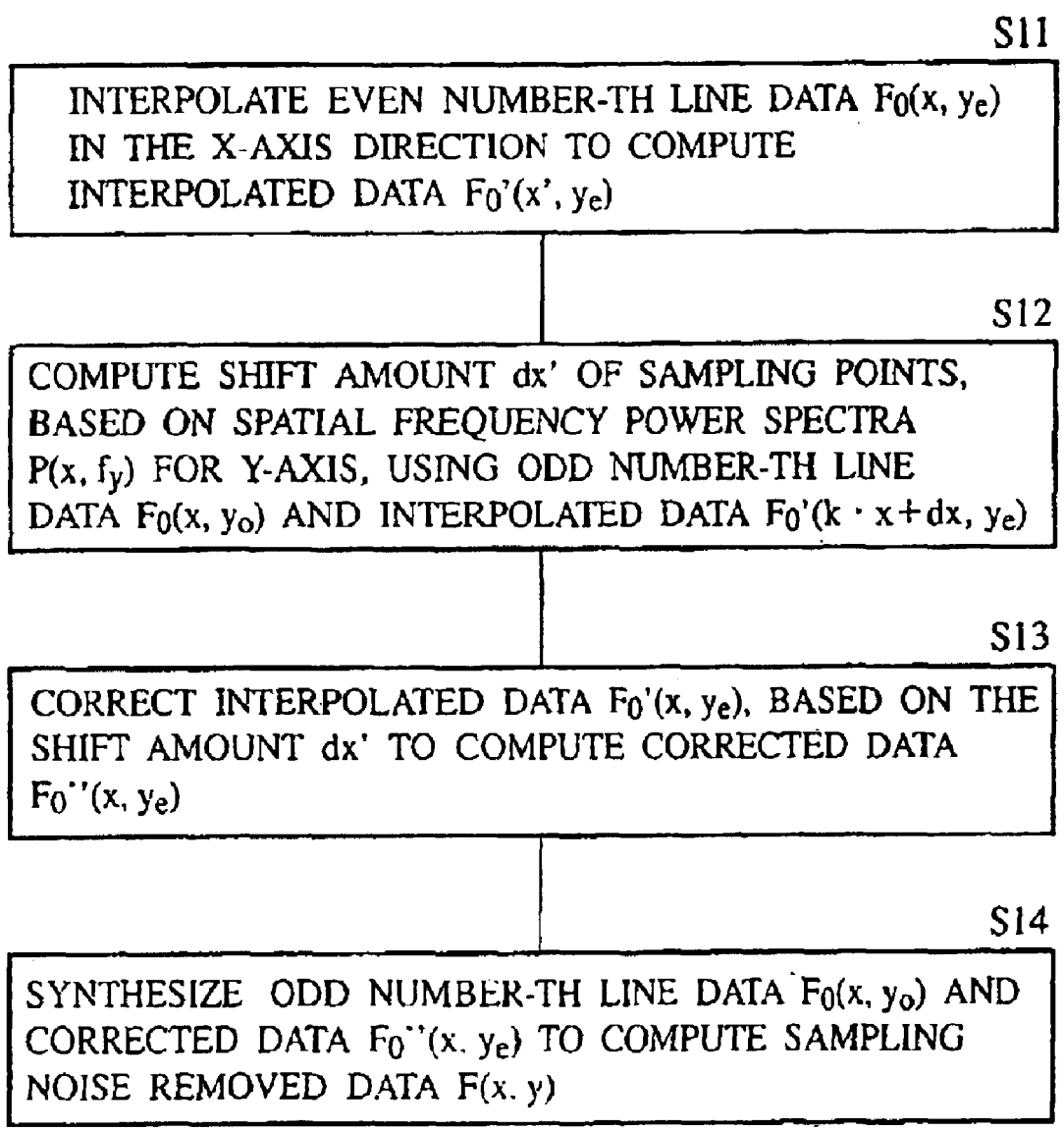
FIG. 2 is a flow chart of a data processing method of the field distribution measuring method according to the embodiment of the present invention.

Then, the data processing unit 50 computes, based on the measured data $F_o(x,y)$, sampling noise removed data $F(x,y)$ with sampling noises removed (see FIG. 2).

First, the interpolating unit 52 performs spline interpolation on the adjustment data stored in the buffer memory 40 to compute interpolated data. In the field distribution measuring method according to the present embodiment, the spline interpolation is performed on the even number-th line data $F_o(x,y_e)$, which is the adjustment data, with respect to the x-axis direction to compute interpolated data $F_o'(x',y_e)$ (step S11). In the spline interpolation, an interval between each of the sampling points and its adjacent one is divided in k, and data at the k points are interpolated. The interpolation is performed with respect to the x-axis direction, whereby a data number in the x-axis direction is k(N+1). That is, $x' = 1, 2, 3, \ldots, k \cdot N, k(N+1).$ The data $F_o(x,y)$, which is a complex number, is divided into a real number and an imaginary number to be vector curves on complex planes and is subjected to spline interpolation for the many-valued function. The spline interpolation is detailed in, e.g., D. F. Rogers and J. A. Adams, "Mathematical Elements for Computer Graphics", McGraw-Hill, 1876.

Then, a shift amount of the sampling points are computed by the shift amount computing unit 54, based on spacial frequency power spectra for the reference sampling data and interpolated data.

Here, first, spatial frequency power spectra for the reference sampling data and the interpolated data are given. In the field distribution measuring method according to the present embodiment, a spacial frequency power spectra for data given by the odd number-th line data $F_o(x,y_o)$ and the interpolated data $F_o'(k \cdot x + dx, y_e)$ with respect to the y-axis direction in M/2 are given. The symbol dx represents a parameter indicative of a shift amount of a sampling point along the x-axis as expressed below.

$$dx = -k+1, -k+2, \ldots, k-1, k.$$

Here, the symbol x' of the interpolated data $F_o'(x',y_e)$ is substituted by $k \cdot x + dx$ so as to give a spatial frequency power spectra in consideration of shifts of the sampling points.

A spatial frequency power spectrum with respect to the y-axis direction $P(x, f_y)$ is given by $$P(x, f_y) = \left| \int F_0(x, y) \cdot e^{j2\pi f_y/M} dy \right|^2 + \left| \int F_0(x, y) \cdot e^{-j2\pi f_y/M} dy \right|^2.$$

Here, when $f_y = M/2$, the above equation can transform as follows.

$$P(x, M/2) = 2 \cdot \left| \sum_{y=1}^{M} (-1)^y \cdot F_0(x, y) \right|^2$$

Thus, a spatial frequency power spectrum can be given by only adding odd number-th line data $F_o(x,y_o)$, and interpolated data of even number-th line data $F_o'(k \cdot x + dx, y_e)$ which are given different signs.

Then, the thus-given spatial frequency power spectra $P(x, M/2)$ are accumulated with respect to the x-axis direction to give an accumulated value $a_{dx}$. That is, the accumulated value $a_{dx}$ is represented by $$a_{dx} = \sum P(x, M/2).$$

The accumulated value $a_{dx}$ is given because, depending on the position in the x-axis direction, the influence of shifts of the sampling point is small, which makes the re-sampling difficult. The accumulated value $a_{dx}$ is given, whereby the influence of shifts of the sampling points is averaged. Based on the accumulated value $a_{dx}$, shifts of the sampling points can be accurately evaluated. An accumulated value $a_{dx}$ may not be essentially given when the case that the influence of shifts of the sampling points is large can be anticipated.

Then, a shift amount dx which gives a minimum value to the accumulated value $a_{dx}$ is searched, and a shift amount dx' at this time is given.

The thus-given shift amount dx' represents an x axial shift amount of sampling points of odd number-th line data $F_o(x,y_o)$ and even number-th line data $F_o(x,y_e)$. That is, a shift amount dx' is represented as follows (Step S12).

$$dx' = 2 \times v \times t_d$$

Figure 3:
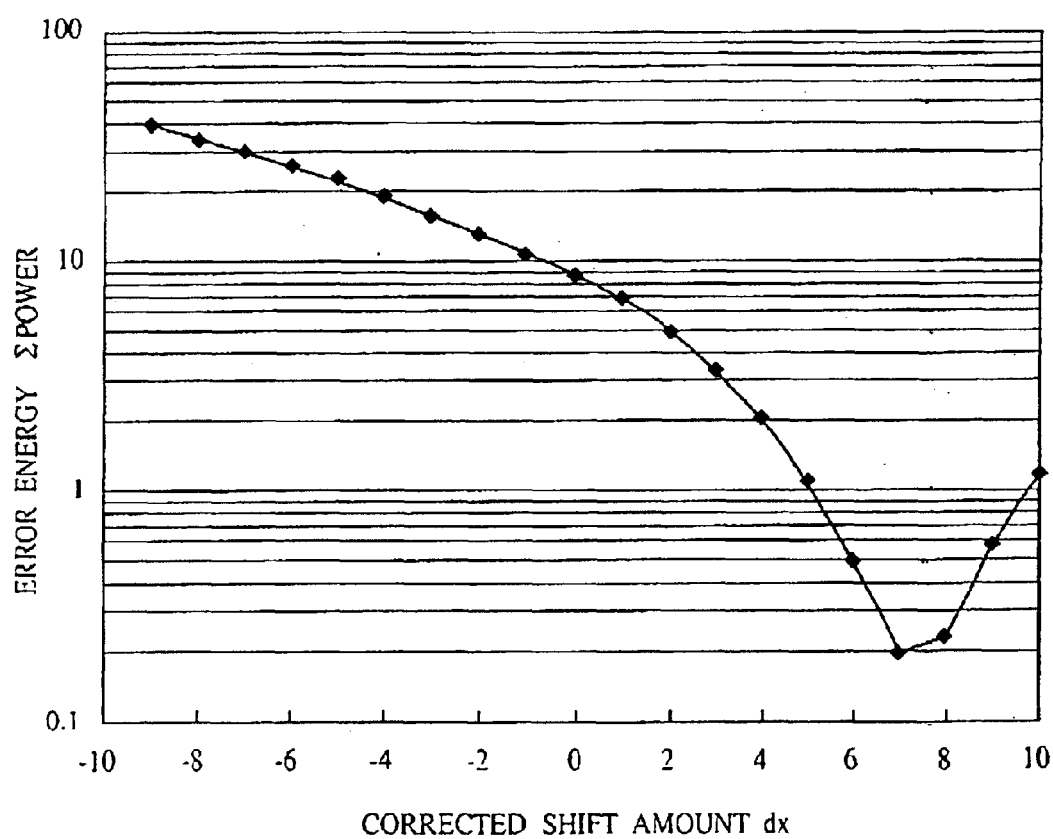
FIG. 3 is a graph of relationships between accumulated values of frequency power spectra and sampling shift amounts.

FIG. 3 is a graph of one example of relationships between accumulated values $a_{dx}$ and shift amounts dx. In the measured result shown in FIG. 3, an interpolation point number k is 10. As shown, in this measured result, an accumulated value $a_{dx}$ is minimum when the shift amount dx is about +7. Thus, the shift amount dx' is +7.

The corrected data processing unit 56 corrects measured data, based on a shift amount computed by the shift amount computing unit 54 to compute corrected data. In the field distribution measuring method according to the present embodiment, contents of even number-th line data $F_o(x,y_e)$ is substituted by a shift amount dx' given by the above-described search processing and interpolated data $F_o'(x',y_e)$ to compute even number-th line corrected data $F_o''(x,y_e)$. That is, the even number-th line corrected data $F_o''(x,y_e)$ is represented as follows (Step S13).

$$F_o''(x,y_e) \leftarrow F_o'(k \cdot x + dx', y_e)$$

Next, the sampling noise removed data computing unit 58 conducts re-sampling, based on the reference sampling data and the corrected data to compute sampling noise removed data. In the field distribution measuring method according to the present embodiment, odd number-th line data $F_o(x,y_o)$ and even number-th line corrected data $F_o''(x,y_e)$ are synthetically substituted to produce sampling noise removed data $F(x,y)$ (step S14).

Then, the computing/display unit 60 processes the sampling noise removed data $F(x,y)$ on the two-dimensional plane to thereby display a two-dimensional field distribution of electric fields or magnetic fields.

Figure 4A:
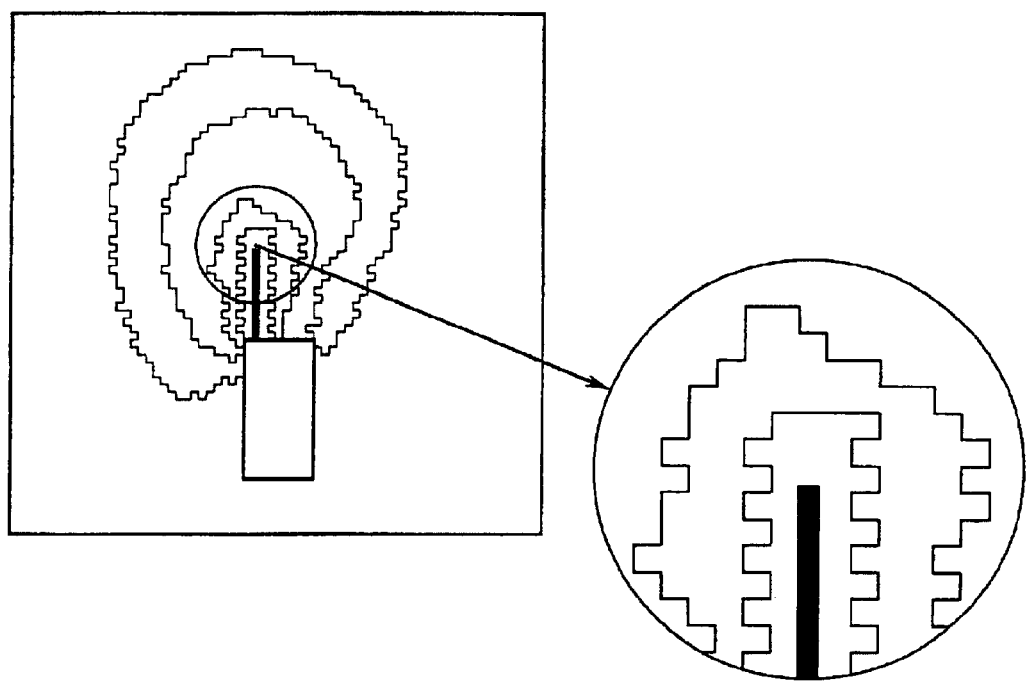
FIG. 4A and FIG. 4B are views of field distributions measured by the conventional field distribution measuring method.
Figure 4B:
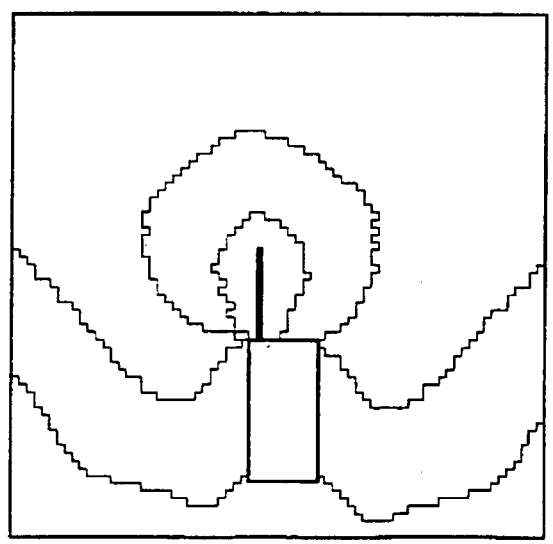

FIG. 4A and FIG. 4B are views of a field distribution of two-dimensional sweep measured data containing sampling noises in the conventional technology, i.e., measured data $F_o(x,y)$ developed on the two-dimensional plane as they are. These data are of a current distribution of a mobile telephone of 1.5 GHz, which was measured by using a small-antenna directivity evaluating apparatus. FIG. 4A shows a plane distribution of amplitude data. FIG. 4B shows a plane distribution of phase data. The shown data copy the measured data. Points where amplitudes or phases are equal are interconnected to show the distribution. The rectangular portion at the center of the drawings indicates the body of the mobile telephone. The straight line extended from the rectangle indicates the antenna. As shown, in the two-dimensional images, the distribution is disturbed in the x-axis direction, which apparently indicates occurrences of sampling point shifts.

Figure 5A:
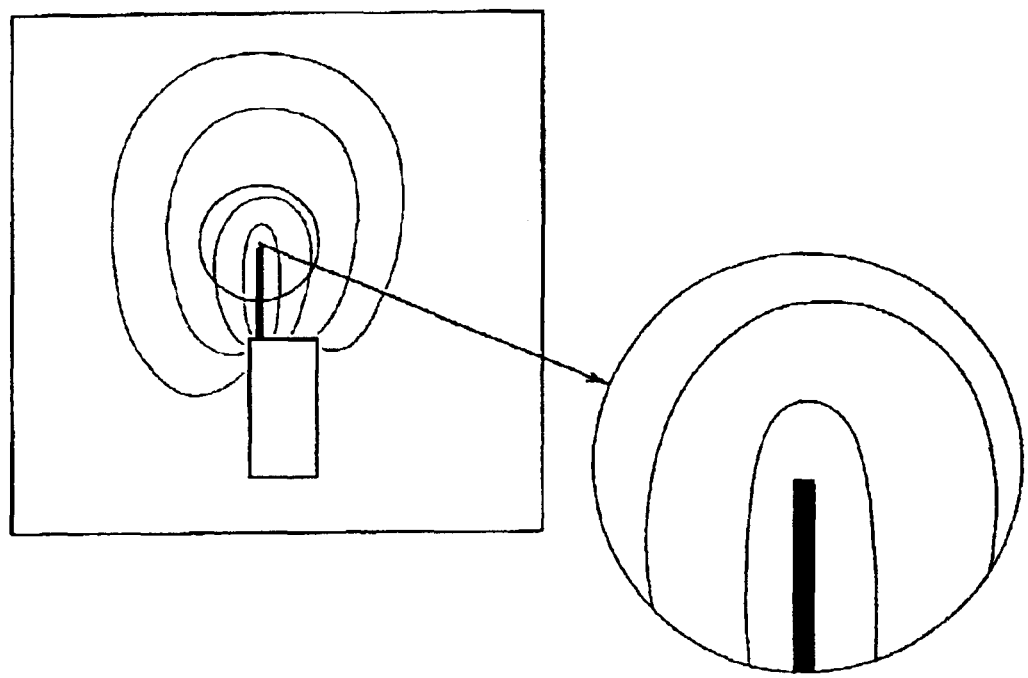
FIG. 5A and FIG. 5B are views of field distributions measured by the field distribution measuring method according to the embodiment of the present invention.
Figure 5B:
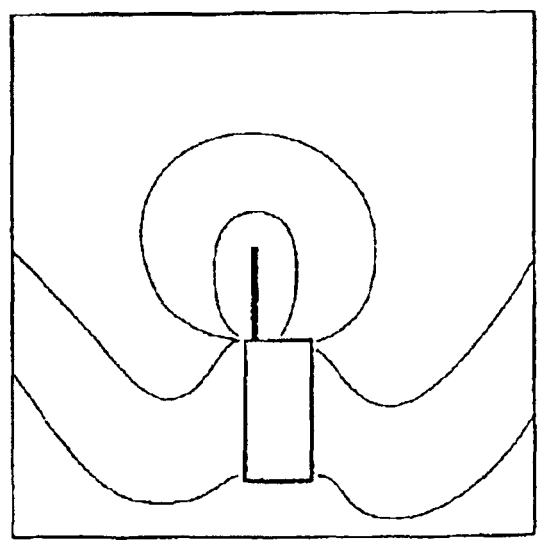
Figure 6:
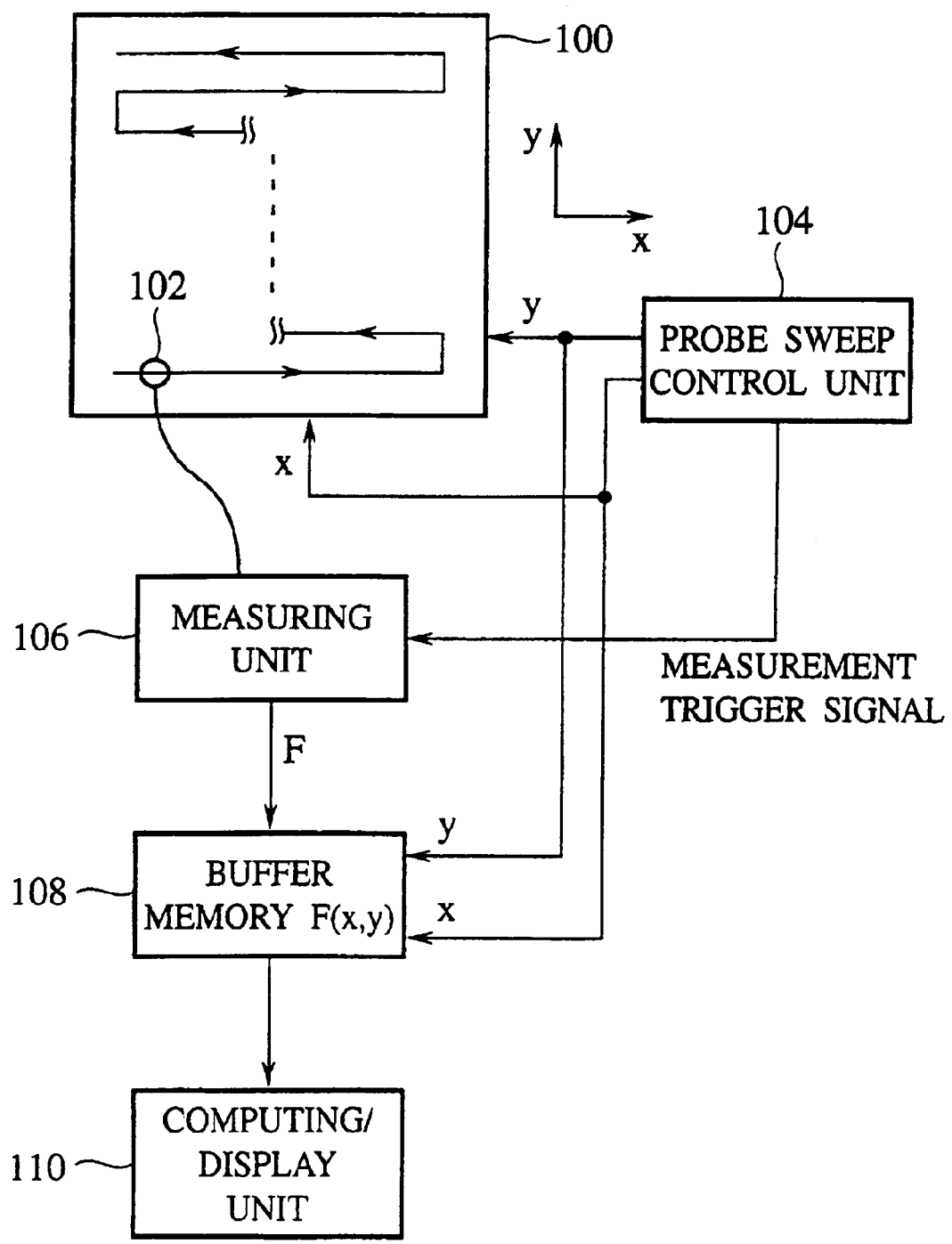
FIG. 6 is a view explaining the conventional field distribution measuring method and apparatus.

FIG. 5A and FIG. 5B are views of a field distribution of two-dimensional sweep measured data with sampling noises removed by the algorithm of the present embodiment, i.e., sampling noise removed data $F(x,y)$ developed on the two-dimensional plane. FIG. 5A is a plane distribution of amplitude data. FIG. 5B is a plane distribution of phase data. As shown, the distributions of these two-dimensional images are smooth, and it is seen that the measured data $F_o(x,y)$ have been properly corrected.

As described above, according to the present embodiment, the field distribution measuring method in which the probe is continuously, moved is comprised of the steps of sweeping a plurality of sampling points, measuring electric fields or magnetic fields to thereby measure a spatial distribution of the electric fields or magnetic fields, wherein a displacement amount of a sampling point is judged based on spurious spectra generated by the displacement between positions of the probe and timings of the measurement, and, in consideration of an amount of the displacement, a distribution of the electric fields or magnetic fields is measured, whereby measuring noises generated by the displacement between probe positions and measuring timings can be properly removed.

The present invention is not limited to the above-described embodiment and can cover other various modifications.

For example, in the above-described embodiment, the field distribution measurement screen 10 is two-dimensional. However, the field distribution measurement screen 10 may be three-dimensional. In this case, the adjustment data have two or more groups. The adjustment parameters are two or more, and the spatial frequency power spectra for the evaluation are two or more dimensional.

In the above-described embodiment, a shift amount dx of sampling points is constant. However, a shift amount may be a variable in consideration of acceleration of the sweep of the probe. In this case, dx may be a function of x, dx(x).

In the above-described embodiment, Fourier transform is used for the evaluation of spatial frequency power spectra. However, in place of Fourier transform, Walsh transform or wavelet transform may be used. Spatial frequency power spectra may be subjected to window function to evaluate the spectra.

In the above-described embodiment, as a most desirable state, a shift amount for minimizing an accumulated value of spatial frequency power spectra is utilized to remove measuring noises, but a shift amount for minimizing an accumulated value of spatial frequency power spectra may not always need to be used. The effect of the present invention is achieved by setting a shift amount dx at a value which makes an accumulated value of spatial frequency power spectra smaller than that without measuring noises removed. Accordingly, measuring noises may be removed by utilizing a shift amount which makes an accumulated value of spatial frequency power spectra below a prescribed value, e.g., below 1/10 of an accumulated value of spatial frequency power spectra without measuring noises removed.

INDUSTRIAL APPLICABILITY

According to the field distribution measuring method and apparatus of the present invention, in measuring spatial distribution of electric fields or magnetic fields by continuously sweeping and measuring at a plurality of sampling points by a probe, which involves spurious spectra generated due to displacement between positions of the probe and measuring timings, a shift amount of the sampling is computed, and a distribution of electric fields or magnetic fields is measured in consideration of the shift amount, whereby measuring noises generated due to offsets of sweeping positions of the probe and the measuring timings can be properly removed. The present invention is useful as field distribution methods and apparatuses for measuring two-dimension distributions of electric fields or magnetic fields of small-antenna directivity evaluating apparatuses, electromagnetic wave monitor visualizing apparatuses, etc.

What is claimed is:

1. A field distribution measuring method for measuring an electric field or a magnetic field comprising the following steps of:

measuring at a plurality of sampling points while continuously sweeping by a probe;

computing a shift amount of the sampling points based on a spurious spectrum generated by a displacement between a first probe position defined by a timing of a trigger signal and stored as position information of the probe and a second probe position defined by a timing of an actual measurement at the sampling point; and measuring a distribution of the electric field or the magnetic field by calculating the second probe position based on the shift amount and the position information, and using the calculated second probe position as an actual position of the sampling point.

2. A field distribution measuring method according to claim 1, further comprising the steps of:

storing a plurality of measured data measured by the probe sweeping in a first direction together with the position information of the probe as reference data;

storing a plurality of measured data measured by the probe sweeping in a second direction opposite to the first direction together with the position information of the probe as adjustment data;

interpolating the adjustment data to compute interpolated data with data between the sampling points interpolated;

computing spatial frequency power spectra for the reference data and the interpolated data; and computing the shift amount of the sampling points, based on the spatial frequency power spectra.

3. A field distribution measuring method according to claim 2, wherein the shift amount of the sampling points is computed based on an accumulated value of the spatial frequency power spectra.

4. A field distribution measuring method according to claim 3, wherein the shift amount of the sampling points is judged, based on a an interpolation point where the accumulated value of the spatial frequency power spectra is below a prescribed value.

5. A field distribution measuring method according to claim 4, wherein the shift amount of the sampling points is judged, based on an interpolation point where the accumulated value of the spatial frequency power spectra is minimum.

6. A field distribution measuring method according to claim 3, wherein the shift amount of the sampling points is judged, based on an interpolation point where the accumulated value of the spatial frequency power spectra is minimum.

7. A field distribution measuring method according to claim 2, wherein the shift amounts relating to the respective sampling points are computed when a sweeping rate of the probe is not constant.

8. A field distribution measuring method according to claim 2, wherein the probe sweeps on a two-dimensional plane.

9. A field distribution measuring method according to claim 2, wherein the probe sweeps in a three-dimensional space.

10. A field distribution measuring method according to claim 4, wherein the shift amounts of relating to the respective sampling points are computed when a sweeping rate of the probe is not constant.

11. A field distribution measuring method according to claim 1, wherein the probe sweeps on a two-dimensional plane.

12. A field distribution measuring method according to claim 1, wherein the probe sweeps in a three-dimensional space.

13. A field distribution measuring apparatus comprising:

a probe for detecting an electric field or a magnetic field at a plurality of sampling points while continuously sweeping on a plane or in a space;

a measuring unit for measuring the electric field or the magnetic field detected by the probe;

a storing unit for storing data of the electric field or the magnetic field measured by the measuring unit together with position data of the probe defined by a timing of a trigger signal;

a data processing unit for computing a shift amount of sampling points generated by a displacement between a first probe position stored in the storing unit as the position data of the probe and a second probe position defined by a timing of an actual measurement at the sampling point; and a computing unit for computing a spatial distribution of the electric field or the magnetic field detected by the probe by calculating the second probe position based on the shift amount and the first probe position and using the calculated second position as an actual position of the sampling point.

14. A field distribution measuring apparatus according to claim 13, wherein the data processing unit computes the shift amount of the sampling points, based on a spurious spectrum generated by the displacement between the first probe position and the second probe position.

* * * * *